(12) United States Patent
Haraguchi

(10) Patent No.: US 11,160,195 B2
(45) Date of Patent: Oct. 26, 2021

(54) ELECTRICAL JUNCTION BOX

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Akira Haraguchi, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/957,528

(22) PCT Filed: Dec. 7, 2018

(86) PCT No.: PCT/JP2018/045173
§ 371 (c)(1),
(2) Date: Jun. 24, 2020

(87) PCT Pub. No.: WO2019/131071
PCT Pub. Date: Jul. 4, 2019

(65) Prior Publication Data
US 2021/0068299 A1    Mar. 4, 2021

(30) Foreign Application Priority Data

Dec. 28, 2017  (JP) .............................. JP2017-254841

(51) Int. Cl.
*H05K 7/20* (2006.01)
*H02G 3/08* (2006.01)
(Continued)

(52) U.S. Cl.
CPC ........... *H05K 7/2039* (2013.01); *H02G 3/081* (2013.01); *H02G 3/16* (2013.01); *B60R 16/0238* (2013.01)

(58) Field of Classification Search
CPC .... B60R 16/0238; H02G 3/081; H02G 3/088; H02G 3/16; H05K 7/1432; H05K 7/2039
See application file for complete search history.

(56) References Cited

U.S. PATENT DOCUMENTS 8,395,884 B1 *   3/2013  Czarnecki ................ H02B 1/48
                                                361/643
2002/0157848 A1 * 10/2002 Chiriku ............... B60R 16/0238
                                                174/50

(Continued)

FOREIGN PATENT DOCUMENTS

JP      2002-305827 A   10/2002
JP      2003-164040 A    6/2003
JP      2015-139289 A    7/2015

OTHER PUBLICATIONS

International Search Report, Application No. PCT/JP2018/045173, dated Jan. 8, 2019. ISA/Japan Patent Office.

*Primary Examiner* — Timothy J Thompson
*Assistant Examiner* — Rhadames Alonzo Miller
(74) *Attorney, Agent, or Firm* — Honigman LLP

(57) ABSTRACT

An electrical junction box includes a first conductive plate, a second conductive plate adjacent to the first conductive plate without contacting the first conductive plate, a switching element including a first terminal connected to the first conductive plate, a second terminal connected to the second conductive plate, and an element body on which the first terminal and the second terminal. A circuit board opposes and is spaced apart from the second conductive plate. A cover has an open side and covers the switching element and the circuit board. The cover includes a partitioning plate that (Continued)

partitions an inside of the cover so as to form a first chamber. The element body of the switching element is arranged in the first chamber, a second chamber is formed inside the cover by the partitioning plate and the second conductive plate, and the circuit board is arranged in the second chamber. An electrical junction box includes a first conductive plate, a second conductive plate adjacent to the first conductive plate without contacting the first conductive plate, a switching element including a first terminal connected to the first conductive plate, a second terminal connected to the second conductive plate, and an element body on which the first terminal and the second terminal. A circuit board opposes and is spaced apart from the second conductive plate. A cover has an open side and covers the switching element and the circuit board. The cover includes a partitioning plate that partitions an inside of the cover so as to form a first chamber. The element body of the switching element is arranged in the first chamber, a second chamber is formed inside the cover by the partitioning plate and the second conductive plate, and the circuit board is arranged in the second chamber.

6 Claims, 11 Drawing Sheets

(51) Int. Cl.
*H02G 3/16* (2006.01)
*B60R 16/023* (2006.01)

(56) References Cited

U.S. PATENT DOCUMENTS

| | | | |
|---|---|---|---|
| 2002/0157852 A1* | 10/2002 | Chiriku | H02G 3/18 174/60 |
| 2002/0168882 A1* | 11/2002 | Chiriku | H01R 9/2466 439/76.2 |
| 2003/0137813 A1 | 7/2003 | Onizuka et al. | |
| 2007/0218721 A1* | 9/2007 | Naritomi | H05K 5/062 439/131 |
| 2009/0243524 A1* | 10/2009 | Katayama | B60L 50/15 318/400.07 |
| 2010/0134975 A1 | 6/2010 | Shimizu et al. | |
| 2010/0218797 A1* | 9/2010 | Coyle, Jr. | H05K 7/026 136/243 |
| 2016/0272073 A1* | 9/2016 | Hosaka | B60L 50/51 |
| 2016/0315455 A1* | 10/2016 | Kiyota | B60R 16/0238 |
| 2017/0088182 A1* | 3/2017 | Hara | B62D 25/2072 |
| 2018/0006414 A1* | 1/2018 | Ooishi | H02G 3/088 |
| 2018/0159403 A1* | 6/2018 | Yokoyama | H02K 11/33 |
| 2018/0310394 A1* | 10/2018 | Kobayashi | H02G 3/03 |
| 2019/0074668 A1* | 3/2019 | Huang | H02B 1/20 |
| 2019/0319440 A1* | 10/2019 | Haraguchi | H05K 1/18 |
| 2020/0211926 A1* | 7/2020 | Tahara | H02G 3/081 |
| 2021/0080084 A1* | 3/2021 | Danesh | F21V 17/002 |

* cited by examiner

ELECTRICAL JUNCTION BOX

CROSS-REFERENCE TO RELATED APPLICATIONS

This application is the U.S. national stage of PCT/JP2018/045173 filed on Dec. 7, 2018, which claims priority of Japanese Patent Application No. JP 2017-254841 filed on Dec. 28, 2017, the contents of which are incorporated herein.

TECHNICAL FIELD

The present disclosure relates to an electrical junction box.

BACKGROUND

In vehicles, an electrical junction box is installed that is connected to a power source and loads such as a headlamp or a wiper is mounted. The electrical junction box electrically connects the power source and the loads to each other and interrupts this connection (see JP 2003-164040A).

In the electrical junction box described in JP 2003-164040A, two bus bars (conductive plates) are placed on a heat dissipation member via an insulating layer. A source terminal and a drain terminal of a FET (switching element) are respectively connected to the two bus bars (conductive plates). The source terminal of the FET is connected to a power source (or a load) via one of the two bus bars, and the drain terminal of the FET is connected to the load (or the power source) via another one of the two bus bars.

A circuit board on which a control element is mounted is placed on the two bus bars. The FET is switched ON/OFF by the control element outputting a control signal. When the FET is switched ON, the two bus bars are electrically connected to each other and a current flows through the FET, and electric power is supplied from the power source to the load. When the FET is switched OFF, the two bus bars are electrically interrupted from each other, a current flowing through the FET is interrupted, and power supply from the power source to the load is stopped.

When a current flows through the FET, the FET generates heat. The heat generated from the FET is conducted to the bus bars, and then to a heat dissipation member, and dissipated from the heat dissipation member to the outside of the electrical junction box.

Generally speaking, heat resistance of a control element is lower than heat resistance of a FET. As such, it is necessary to prevent heat of a high temperature from being conducted from the FET to the circuit board.

However, in the electrical junction box described in JP 2003-164040A, the bus bars are respectively in contact with the heat dissipation member and the circuit board. Accordingly, when the heat dissipation member is thermally saturated, there is a risk that heat of a high temperature will be conducted from the heat dissipation member to the control element of the circuit board via the bus bars.

In view of this, an electrical junction box is provided which can suppress heat from being conducted to a circuit board.

SUMMARY

An electrical junction box according to one aspect of the present embodiment includes a first conductive plate, a second conductive plate that is adjacent to the first conductive plate without contacting the first conductive plate, a switching element including a first terminal that is connected to the first conductive plate, a second terminal that is connected to the second conductive plate, and an element body on which the first terminal and the second terminal are provided, a circuit board that opposes and is spaced apart from the second conductive plate, and a cover that is shaped as a box having an open side and covers the switching element and the circuit board, and the cover includes a partitioning plate that partitions an inside of the cover, a first chamber is formed inside the cover by the partitioning plate and the first conductive plate, the element body of the switching element is arranged in the first chamber, a second chamber is formed inside the cover by the partitioning plate and the second conductive plate, and the circuit board is arranged in the second chamber.

Advantageous Effects of Disclosure

According to this disclosure, it is possible to provide an electrical junction box that can suppress heat from being conducted to a circuit board.

DETAILED DESCRIPTION OF PREFERRED EMBODIMENTS

Figure 1:
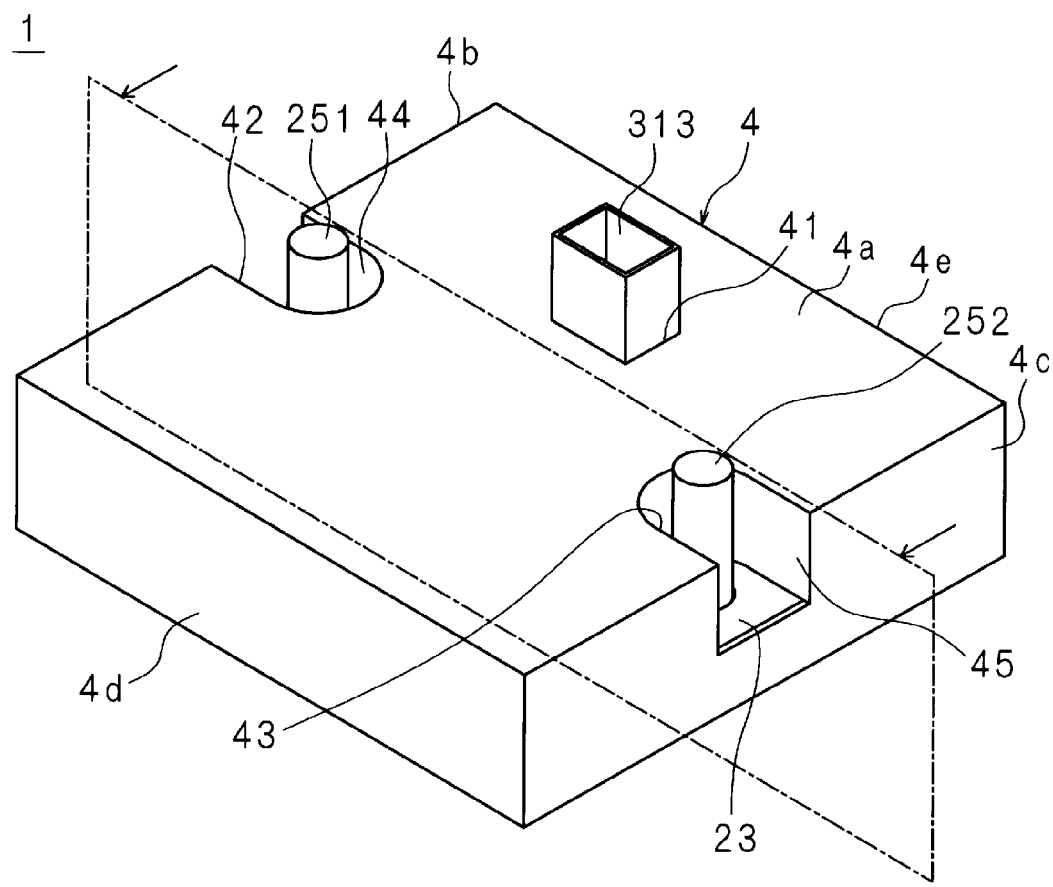
FIG. 1 is a perspective view of an electrical junction box according to an embodiment.

First, aspects of this disclosure will be listed and illustrated. At least some of the aspects described below may also be combined as appropriate.

An electrical junction box according to one aspect includes a first conductive plate, a second conductive plate that is adjacent to the first conductive plate without contacting the first conductive plate, a switching element including a first terminal that is connected to the first conductive plate, a second terminal that is connected to the second conductive plate, and an element body on which the first terminal and the second terminal are provided, a circuit board that opposes and is spaced apart from the second conductive plate, and a cover that is shaped as a box having an open side and covers the switching element and the circuit board, and the cover includes a partitioning plate that partitions an inside of the cover, a first chamber is formed inside the cover by the partitioning plate and the first conductive plate, the element body of the switching element is arranged in the first chamber, a second chamber is formed inside the cover by the partitioning plate and the second conductive plate, and the circuit board is arranged in the second chamber.

In this aspect, the first chamber and the second chamber are formed inside the cover.

The first terminal of the switching element is connected to the first conductive plate. The first conductive plate and the partitioning plate of the cover form the first chamber. The element body of the switching element is arranged in the first chamber.

The second terminal of the switching element is connected to the second conductive plate. The second conductive plate and the partitioning plate of the cover form the second chamber. The circuit board is arranged in the second chamber.

The second conductive plate and the circuit board oppose each other with a gap therebetween.

Although most of the heat generated from the switching element is conducted to the first conductive plate, some of the heat is conducted to the second conductive plate as well. Since the circuit board is spaced apart from the first conductive plate and the second conductive plate, it is possible to prevent heat of a high temperature from being conducted from the first conductive plate or the second conductive plate to the circuit board.

Heat generated from the switching element and heat conducted to the first conductive plate heats and convects the air in the first chamber. Since the circuit board is arranged in the second chamber, it is possible to prevent heat of a high temperature from being conducted to the circuit board due to the air convection in the first chamber.

As a result, it is possible to suppress heat from being conducted to the circuit board.

Furthermore, since the first conductive plate also serves as the partitioning plate for partitioning the first chamber from the outside and the second conductive plate also serves as the partitioning plate for partitioning the second chamber from the outside, it is possible to decrease the size of the electrical junction box.

In the electrical junction box according to another aspect, a configuration is also preferable in which the electrical junction box includes a heat dissipation member having one side in which a recessed portion is provided, and the first conductive plate is attached to the one side of the heat dissipation member, and the second conductive plate is adjacent to the first conductive plate in the direction along the one side of the heat dissipation member, opposes a bottom surface of the recessed portion of the heat dissipation member, and is spaced apart from the heat dissipation member.

In this aspect, the first conductive plate is attached to the one side of the heat dissipation member. Accordingly, heat conducted from the switching element to the first conductive plate is further conducted to the heat dissipation member.

Since the second conductive plate is spaced apart from the heat dissipation member, even if the heat dissipation member is thermally saturated, there is no risk that heat will be conducted from the heat dissipation member to the second conductive plate. Accordingly, it is possible to prevent air convection in the second chamber due to heat conducted from the heat dissipation member to the second conductive plate, and prevent heat of a high temperature from being conducted to the circuit board due to the air convection in the second chamber.

As a result, even if the heat dissipation member is thermally saturated, it is possible to suppress heat from being conducted to the circuit board.

In the electrical junction box according to another aspect, a configuration is also preferable in which the first conductive plate is attached to the one side of the heat dissipation member via an insulative heat conductive portion.

In this aspect, it is possible to efficiently conduct heat conducted from the switching element to the first conductive plate to the heat dissipation member via the heat conductive portion.

In the electrical junction box according to another aspect, a configuration is also preferable in which the electrical junction box includes a third conductive plate that is adjacent to the second conductive plate without contacting the second conductive plate, and a second switching element that has a third terminal connected to the third conductive plate, a fourth terminal connected to the second conductive plate, and a second element body on which the third terminal and the fourth terminal are provided, and the cover includes a second partitioning plate that partitions an inside of the cover, the second chamber is formed inside the cover by the partitioning plate, the second partitioning plate, and the second conductive plate, a third chamber is formed inside the cover by the second partitioning plate and the third conductive plate, and the second element body of the second switching element is arranged in the third chamber.

In this aspect, the first to third chambers are formed inside the cover.

The third terminal of the second switching element is connected to the third conductive plate. The third conductive plate and the second partitioning plate of the cover form the third chamber. The second element body of the second switching element is arranged in the third chamber.

The fourth terminal of the second switching element is connected to the second conductive plate. The second conductive plate and the partitioning plate and the second partitioning plate of the cover form the second chamber.

Although most of the heat generated from the second switching element is conducted to the third conductive plate, some of the heat is conducted to the second conductive plate as well. Since the circuit board is spaced apart from the second conductive plate and the third conductive plate, it is possible to prevent heat of a high temperature from being conducted from the second conductive plate and the third conductive plate to the circuit board.

Heat generated from the second switching element and heat conducted to the third conductive plate heats and convects the air in the third chamber. Since the circuit board is arranged in the second chamber, it is possible to prevent heat of a high temperature from being conducted to the circuit board due to the air convection in the third chamber.

As a result, it is possible to suppress heat from being conducted to the circuit board.

Furthermore, since the third conductive plate also serves as the partitioning plate for partitioning the third chamber from the outside, it is possible to decrease the size of the electrical junction box.

Specific examples of the electrical junction box according to the embodiment will be described with reference to the drawings below. Note that the present disclosure is not limited to these examples, and is defined by the claims, and all changes within the meaning and range of equivalency of the claims are intended to be embraced therein.

FIG. 1 is a perspective view of an electrical junction box according to an embodiment.

Figure 2:
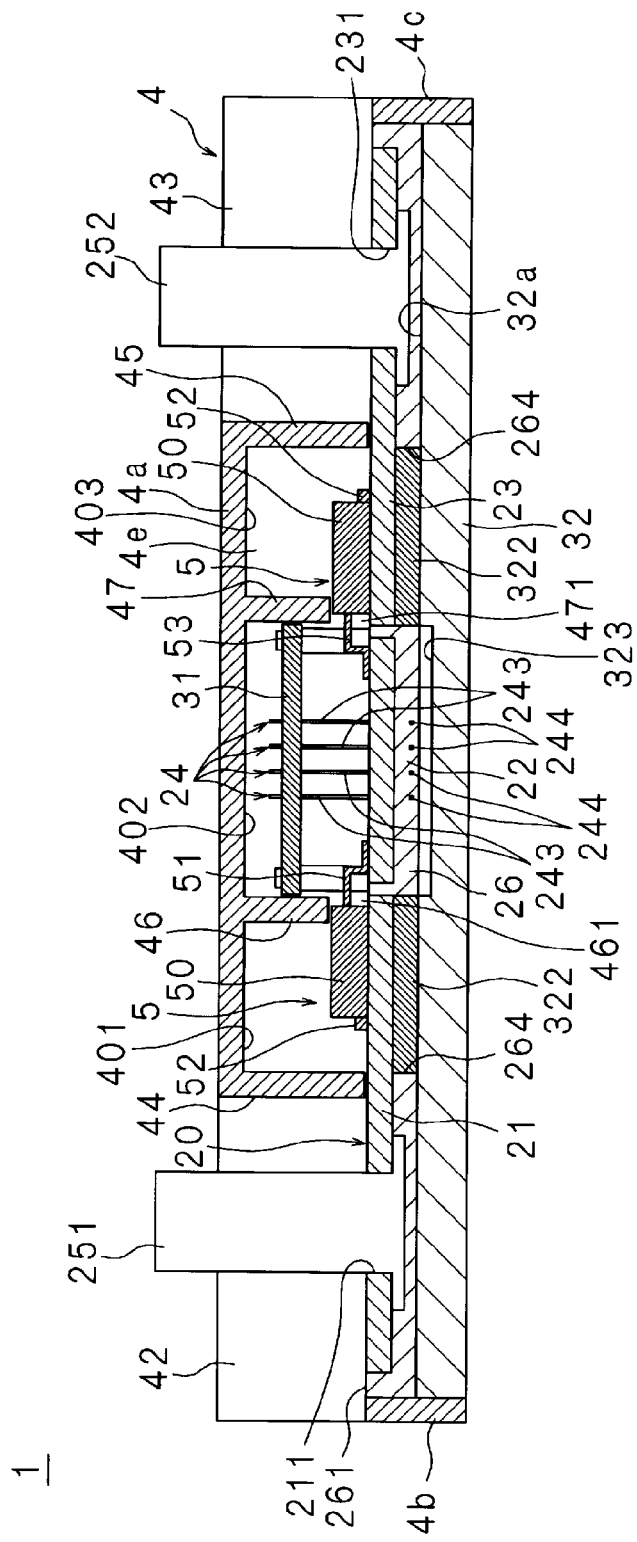
FIG. 2 is a cross-sectional view of the electrical junction box.

FIG. 2 is a cross-sectional view of the electrical junction box.

Figure 3:
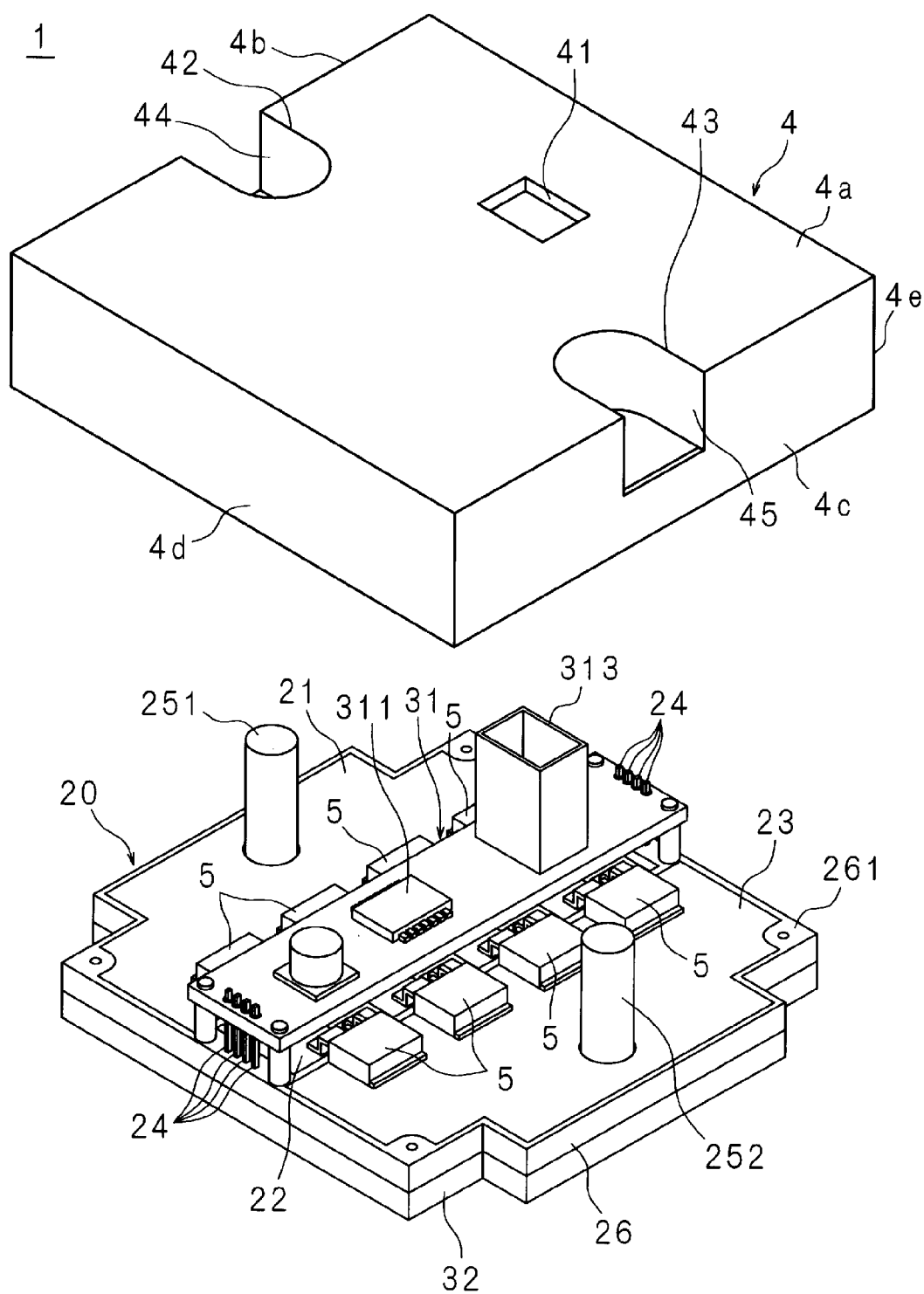
FIG. 3 is an exploded perspective view of the electrical junction box.

FIG. 3 is an exploded perspective view of the electrical junction box.

Reference numeral 1 in the drawings denotes an electrical junction box. The electrical junction box 1 is provided with a first bus bar 21 (first conductive plate), a second bus bar 22 (second conductive plate), a third bus bar 23 (third conductive plate), eight conductive members 24, two bolts 251 and 252, a circuit board 31, a heat dissipation member 32, and a cover 4.

Figure 4:
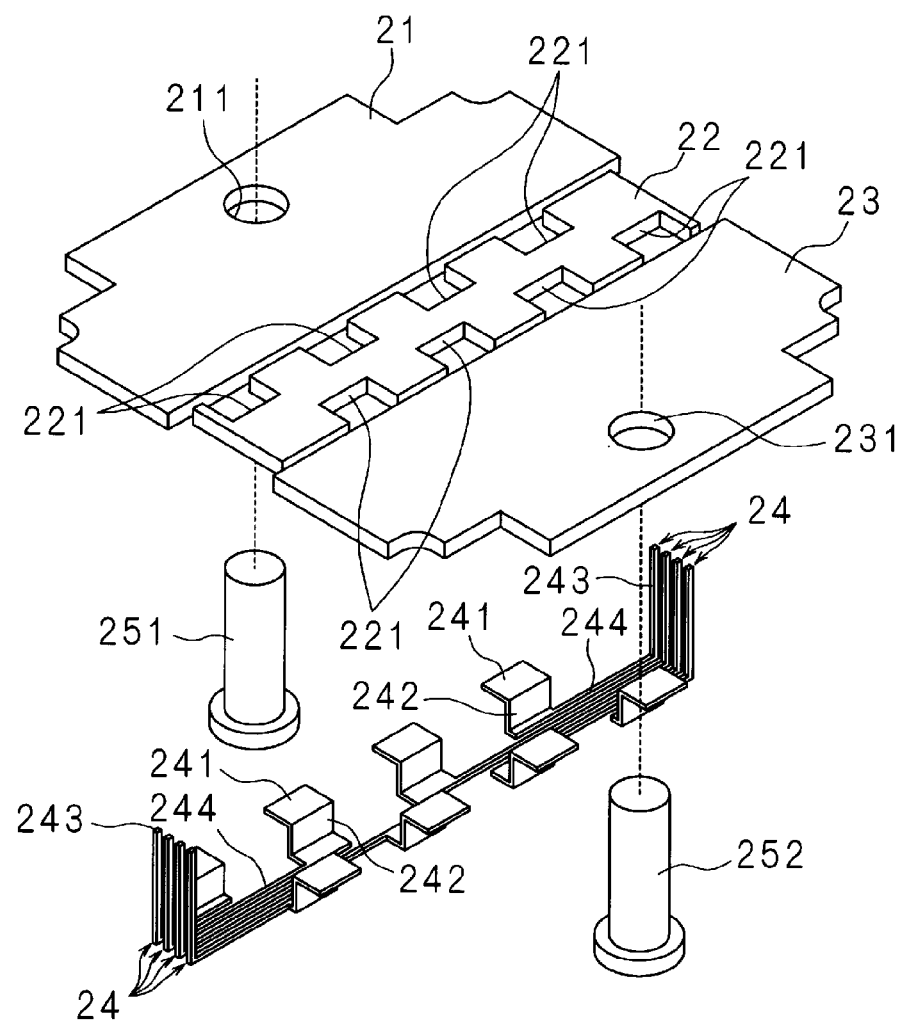
FIG. 4 is a perspective view illustrating a first bus bar, a second bus bar, a third bus bar, conductive members, and bolts.

FIG. 4 is a perspective view illustrating the first bus bar 21, the second bus bar 22, the third bus bar 23, the conductive member 24, and the bolts 251 and 252.

Figure 5:
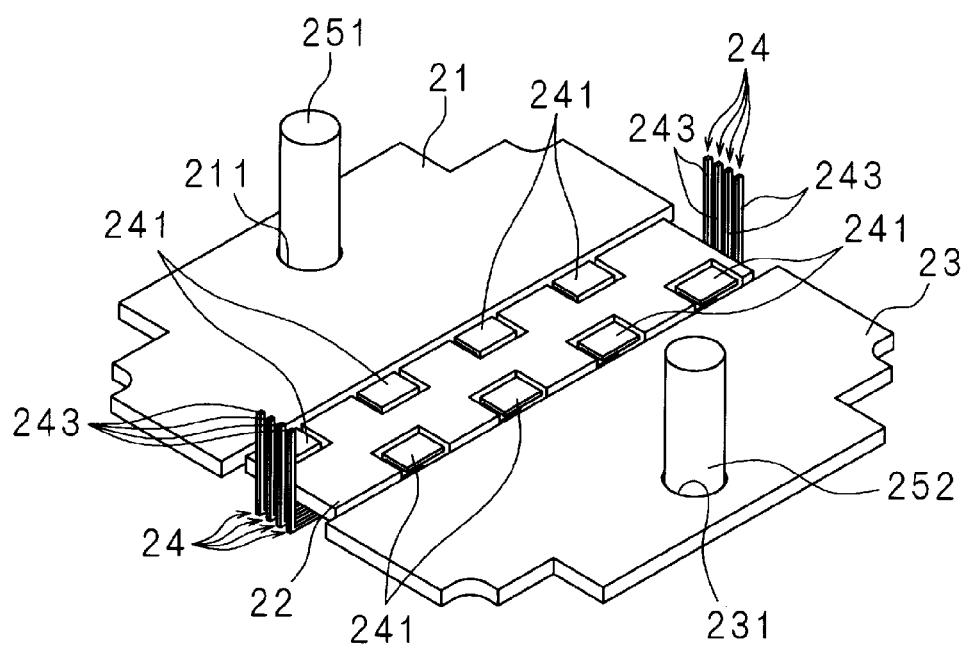
FIG. 5 is a perspective view illustrating a positional relationship between the first bus bar, the second bus bar, the third bus bar, the conductive members, and the bolts.

FIG. 5 is a perspective view illustrating the positional relationship between the first bus bar 21, the second bus bar 22, the third bus bar 23, the conductive member 24, and the bolts 251 and 252.

As shown in FIGS. 2 to 5, the first bus bar 21 is shaped as a rectangular plate. A through hole 211 is provided in one long side portion of the first bus bar 21. The through hole 211 is arranged in the middle in the longitudinal direction of the first bus bar 21. The first bus bar 21 is conductive and made of metal, for example.

A shaft portion of the bolt 251 is crimped to the through hole 211 of the first bus bar 21. The shaft portion of the bolt 251 protrudes from one side of the first bus bar 21 in a direction perpendicular to the one side of the first bus bar 21. The head portion of the bolt 251 is in contact with another side of the first bus bar 21.

The configuration of the third bus bar 23 is the same as the first bus bar 21. A shaft portion of the bolt 252 is crimped to a through hole 231 of the third bus bar 23.

The second bus bar 22 is shaped as a rectangular plate. Four cutouts 221 are arranged in a row in each of the long side portions of the second bus bar 22. The four cutouts 221 of the one long side portion of the second bus bar 22 and the four cutouts 221 of the other long side portion of the second bus bar 22 are arranged in a zigzag form. Each cutout 221 is rectangular.

The thicknesses of the first bus bar 21, the second bus bar 22, and the third bus bar 23 are approximately the same.

The conductive members 24 each are conductive and made of metal, for example. Each conductive member 24 has a connection plate 241, a protruding portion 242, a connection pin 243, and a joining portion 244. The connection plate 241 is rectangular. The connection plate 241 is thinner than the second bus bar 22. The protruding portion 242 vertically protrudes from one side of the connection plate 241. The length direction of the connection pin 243 is in parallel with the direction in which the protruding portion 242 protrudes. The joining portion 244 joins one edge of the protruding portion 242 and one end of the connection pin 243 to each other. The protruding portion 242 and the connection pin 243 protrude from the joining portion 244 in the same direction.

The first bus bar 21 to which the bolt 251 is fixed, the second bus bar 22, the third bus bar 23 to which the bolt 252 is fixed, and the eight conductive members 24 are formed in one piece, with an insulating portion 26 ensuring that they do not contact each other. The insulating portion 26 is made of a synthetic resin.

Hereinafter, a member constituted by the first bus bar 21, the second bus bar 22, the third bus bar 23, the eight conductive members 24, and the bolts 251 and 252 that are formed in one piece is called a base 20.

Figure 6:
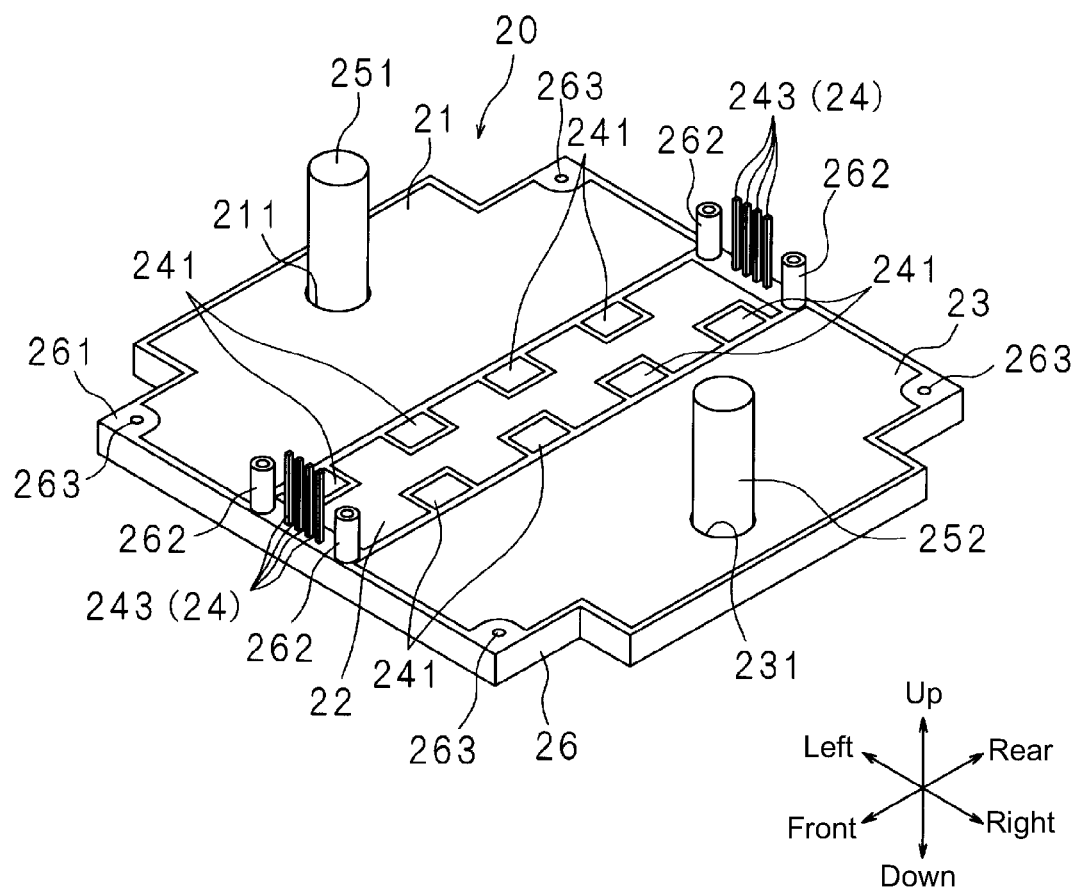
FIG. 6 is a perspective view of a base.
Figure 7:
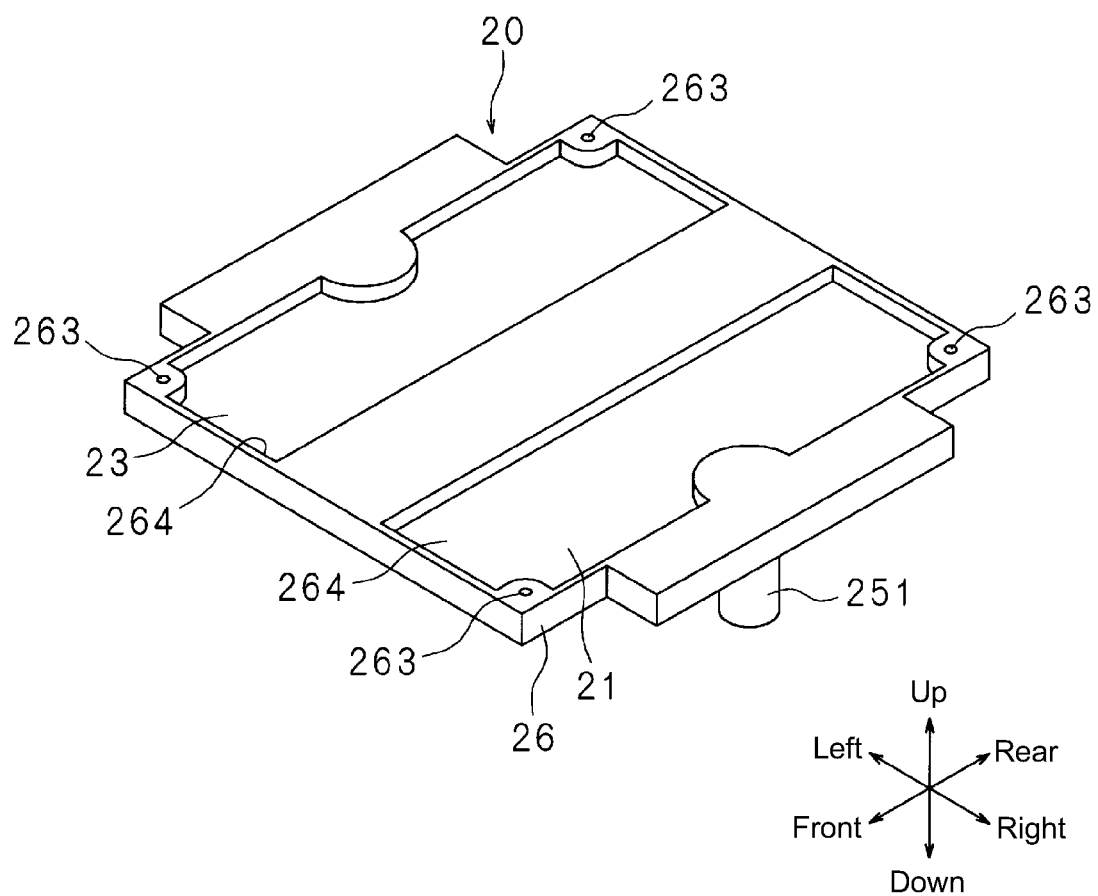
FIG. 7 is another perspective view of the base.

FIG. 6 is a perspective view of the base 20. FIG. 7 is another perspective view of the base 20. Hereinafter, the description will be given using the upper, lower, left, and right directions shown in FIGS. 6 and 7.

Specifically, FIG. 6 is a perspective view of the base 20 seen from above, and FIG. 7 is a perspective view of the base 20 seen from below. The longitudinal direction of the first bus bar 21 is the front-rear direction, the short direction of the first bus bar 21 is the left-right direction, and the direction perpendicular to the first bus bar 21 is the vertical direction. Also, the direction in which the shaft portion of the bolt 251 of the first bus bar 21 protrudes is upward. The through hole 211 is provided in the left side portion of the first bus bar 21.

In the base 20, the first bus bar 21, the second bus bar 22, and the third bus bar 23 are arranged from the left to the right in this order, so that the longitudinal directions of the bus bars are in parallel with each other.

A lower surface and end faces of the first bus bar 21 and the head portion of the bolt 251 are covered with the insulating portion 26. An upper surface of the first bus bar 21 and the shaft portion of the bolt 251 are not covered with the insulating portion 26.

A right end face of the first bus bar 21 opposes a left end face of the second bus bar 22. The insulating portion 26 is located between the right end face of the first bus bar 21 and the left end face of the second bus bar 22. An upper (lower) surface of the first bus bar 21 and the one (other) side of the second bus bar 22 are virtually coplanar.

A lower surface and end faces of the second bus bar 22 are covered with the insulating portion 26. Inner faces of the cutouts 221 of the second bus bar 22 (see FIG. 4) are covered with the insulating portion 26. An upper surface of the second bus bar 22 is not covered with the insulating portion 26.

The third bus bar 23 is arranged so that a surface from which the shaft portion of the bolt 252 protrudes faces upward, and a long side portion in which the through hole 231 is provided faces rightward.

A left end face of the third bus bar 23 opposes a right end face of the second bus bar 22. The insulating portion 26 is provided between the left end face of the third bus bar 23 and the right end face of the second bus bar 22. An upper (lower) surface of the third bus bar 23 and the one (other) side of the second bus bar 22 are virtually coplanar.

The lower surface and end faces of the third bus bar 23 and the head portion of the bolt 252 are covered with the insulating portion 26. The upper surface of the third bus bar 23 and the shaft portion of the bolt 252 are not covered with the insulating portion 26.

The connection plates 241 of the conductive members 24 are inserted into the cutouts 221 (see. FIG. 4) of the second bus bar 22 so that the protruding portions 242 protrude downward from the connection plates 241. One (other) side of the connection plates 241 and the upper (lower) surface of the second bus bar 22 are virtually coplanar. The insulating portion 26 is provided between the connection plates 241, the second bus bar 22, and the first bus bar 21 (or the third bus bar 23). The joining portions 244 are downwardly spaced apart from the second bus bar 22, and extend frontward (or rearward) from the protruding portions 242 (see FIGS. 2 and 4). The connection pins 243 protrude upwardly from the joining portions 244 in front of a front end face (or behind a back end face) of the second bus bar 22 (see FIG. 5). The connection pins 243 of the four conductive members 24 on the front (or rear) side, out of the eight conductive members 24, are arranged in the left-right direction in front of (or behind) the second bus bar 22.

The lower surfaces and end faces of the connection plates 241, the lower half of the connection pins 243, the protruding portions 242, and the joining portions 244 are covered with the insulating portion 26 (see FIG. 2). The upper surfaces of the connection plates 241 and the upper half of the connection pins 243 are not covered with the insulating portion 26.

An upper surface 261 of the insulating portion 26, the upper surfaces of the first bus bar 21, the second bus bar 22, the third bus bar 23, and the connection plates 241 of the conductive members 24 are level with each other (see FIG. 2). The four bosses 262 protrude upwardly from the upper surface 261. The four bosses 262 are respectively adjacent to the four corners of the second bus bar 22. A female screw is provided on an inner surface of the bosses 262.

The insulating portion 26 is provided with a plurality of screw holes 263 that vertically penetrate therethrough.

The insulating portion 26 is provided with two openings 264. The two openings 264 are respectively located below the first bus bar 21 and the third bus bar 23 (see FIG. 2). Wide regions of the lower surfaces of the first bus bar 21 and the third bus bar 23 are exposed from the two openings 264.

As shown in FIG. 3, the electrical junction box 1 further includes eight switching elements 5.

Figure 8:
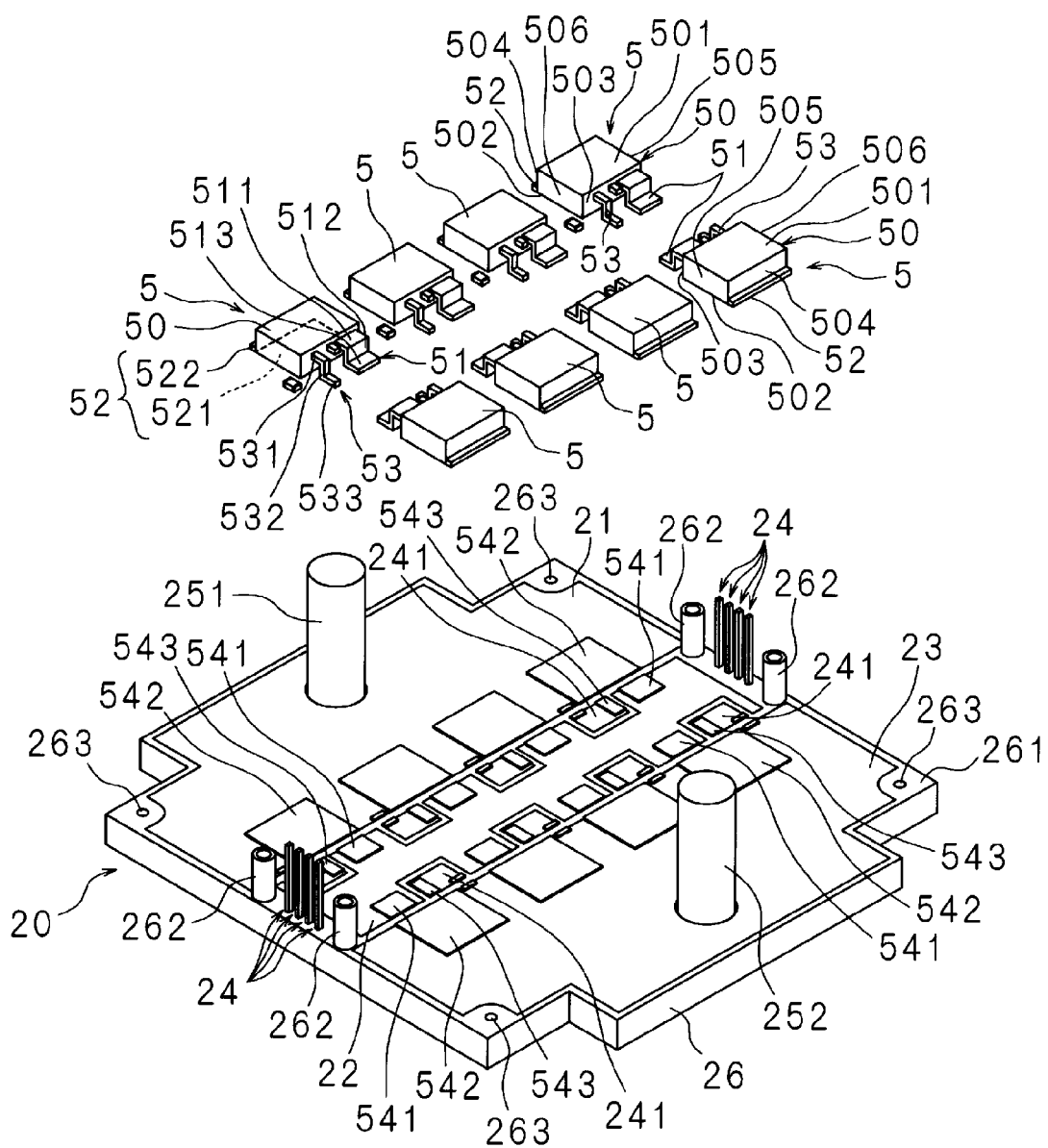
FIG. 8 is a perspective view illustrating how switching elements are attached to the base.

FIG. 8 is a perspective view illustrating how the switching elements 5 are attached to the base 20.

Each switching element 5 is a FET and includes an element body 50, a source terminal 51, a drain terminal 52, and a gate terminal 53. The switching element 5 is switched ON or OFF in accordance with the voltage at the gate terminal 53.

The eight switching elements 5 are attached to the base 20 so that four element bodies 50 are arranged in the front-rear direction and two in the left-right direction.

The source terminals 51 and the drain terminals 52 of the switching elements 5 on the left side (the first bus bar 21 side) are respectively first terminals and second terminals.

The switching elements 5 on the right side (the third bus bar 23 side) are second switching elements. The element bodies 50, the source terminals 51, and the drain terminals 52 of the switching elements 5 on the right side are respectively second element bodies, third terminals, and fourth terminals.

Each element body 50 is shaped as a flat cuboid. The element body 50 is arranged at the base 20 so that the largest two surfaces, out of the six surfaces of the element body 50, face in the vertical direction, and the long sides of this surfaces extend in the front-rear direction. Hereinafter, the two largest surfaces of the element body 50 are called an upper surface 501 and a lower surface 502. Also, two surfaces continuous with the long sides of the upper surface 501 are called side faces 503 and 504, and two surfaces continuous with the short sides of the upper surface 501 are called side faces 505 and 506.

The source terminal 51 is provided on the side face 503 of each element body 50. The source terminal 51 includes a protruding portion 511, a hanging portion 512, and a connection portion 513. The protruding portion 511 protrudes from the side face 503 in the direction perpendicular to the side face 503. The hanging portion 512 hangs down from the protruding portion 511. The connection portion 513 protrudes from the hanging portion 512 in the same direction as the direction in which the protruding portion 511 protrudes, and the lower surface of the connection portion 513 and the lower surface 502 of the element body 50 are virtually coplanar.

The gate terminal 53 is provided on the side surface 503 of each element body 50. The gate terminal 53 includes a protruding portion 531, a hanging portion 532, and a connection portion 533, that are similar to the protruding portion 511, the hanging portion 512, and the connection portion 513 of the source terminal. The protruding portion 531 protrudes from the side face 503 in the direction perpendicular to the side face 503.

The source terminal 51 and the gate terminal 53 are adjacent to each other in the front-rear direction. The source terminal 51 is located at a position near the side face 505 on the side face 503. On the other hand, the gate terminal 53 is located at a position near the side face 506 on the side face 503.

The drain terminal 52 is provided on the lower surface 502 and the side surface 504 of each element body 50. The drain terminal 52 includes a foil portion 521 and an extending portion 522. The foil portion 521 covers and is in contact with the lower surface 502. Since the foil portion 521 is sufficiently thin, the thickness of the foil portion 521 can be ignored. The extending portion 522 is continuous with the foil portion 521, and extends from the side surface 504 in the direction perpendicular to the side surface 504.

The four of the eight switching elements 5 are connected to the first bus bar 21, and the other four are connected to the third bus bar 23.

The switching elements 5 connected to the first bus bar 21 are connected to the first bus bar 21, the second bus bar 22 and the conductive members 24 so that each side surface 503 on which the source terminal 51 and the gate terminal 53 are provided faces rightward, and each side surface 505 near the source terminal 51 faces rearward.

Specifically, the connection portion 513 of each source terminal 51 is connected to the rear portion of the connection plate 241 on the upper surface of the second bus bar 22 with a solder 541. Also, each drain terminal 52 is connected to the upper surface of the first bus bar 21 with a solder 542. Furthermore, the connection portion 533 of each gate terminal 53 is connected to the upper surface of the connection plate 241 of each conductive member 24 with a solder 543.

The switching elements 5 connected to the third bus bar 23 are connected to the second bus bar 22, the third bus bar 23, and the conductive members 24 so that each side surface 503 on which the source terminal 51 and the gate terminal 53 are provided faces leftward, and each side surface 505 near the source terminal 51 faces frontward.

Specifically, the connection portion 513 of each source terminal 51 is connected to the front portion of the cutout 221 on the upper surface of the second bus bar 22 with the solder 541. Also, each drain terminal 52 is connected to the upper surface of the third bus bar 23 with the solder 542. Furthermore, the connection portion 533 of the gate terminal 53 is connected to the upper surface of the connection plate 241 of each conductive member 24 with the solder 543.

Figure 9:
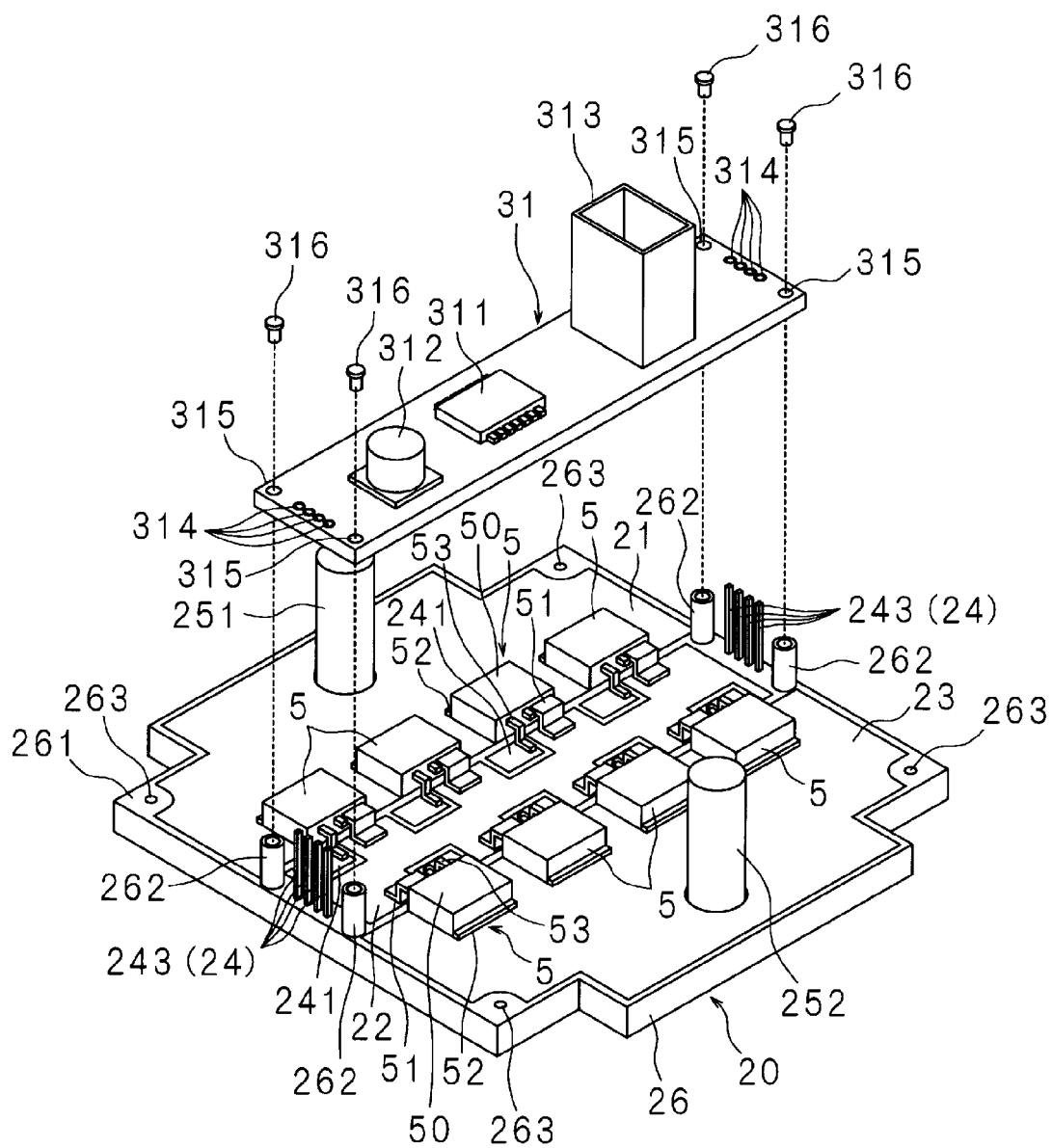
FIG. 9 is a perspective view illustrating how a circuit board is attached to the base.

FIG. 9 is a perspective view illustrating how the circuit board 31 is attached to the base 20.

The circuit board 31 is rectangular. A conductive path formed of a metal foil is provided on one side of the circuit board 31. Also, a control element 311, a driving circuit 312, and a connector 313 are mounted on the one side of the circuit board 31. The connector 313 is not shown in FIG. 2.

As shown in FIG. 9, four through holes 314 arranged in parallel with each other in the short direction of the circuit board 31 are provided on the short side portions of the circuit board 31. Four insertion holes 315 are provided in the four corners of the circuit board 31.

The control element 311 is a microprocessor, for example. The control element 311 is electrically connected to the driving circuit 312 and the connector 313 via the conductive path of the circuit board 31. The driving circuit 312 and the through holes 314 are electrically connected to each other via the conductive path of the circuit board 31.

The circuit board 31 is attached to the base 20 so that the control element 311 and the connector 313 face upward, and the conductive members 24 and the control element 311 are electrically connected to each other. Specifically, the connection pins 243 on the front side are fitted into the through holes 314 in one short side portion of the circuit board 31. On the other hand, the connection pins 243 on the rear side are fitted into the through holes 314 in another short side portion of the circuit board 31. Furthermore, the circuit board 31 is screwed to the base 20 by the screws 316 being inserted into the insertion holes 315 and screwed to the boss 262. The lower surface of the circuit board 31 and the upper surface of the second bus bar 22 oppose and are spaced apart from each other. The circuit board 31 and the second bus bar 22 are in parallel with each other.

Figure 10:
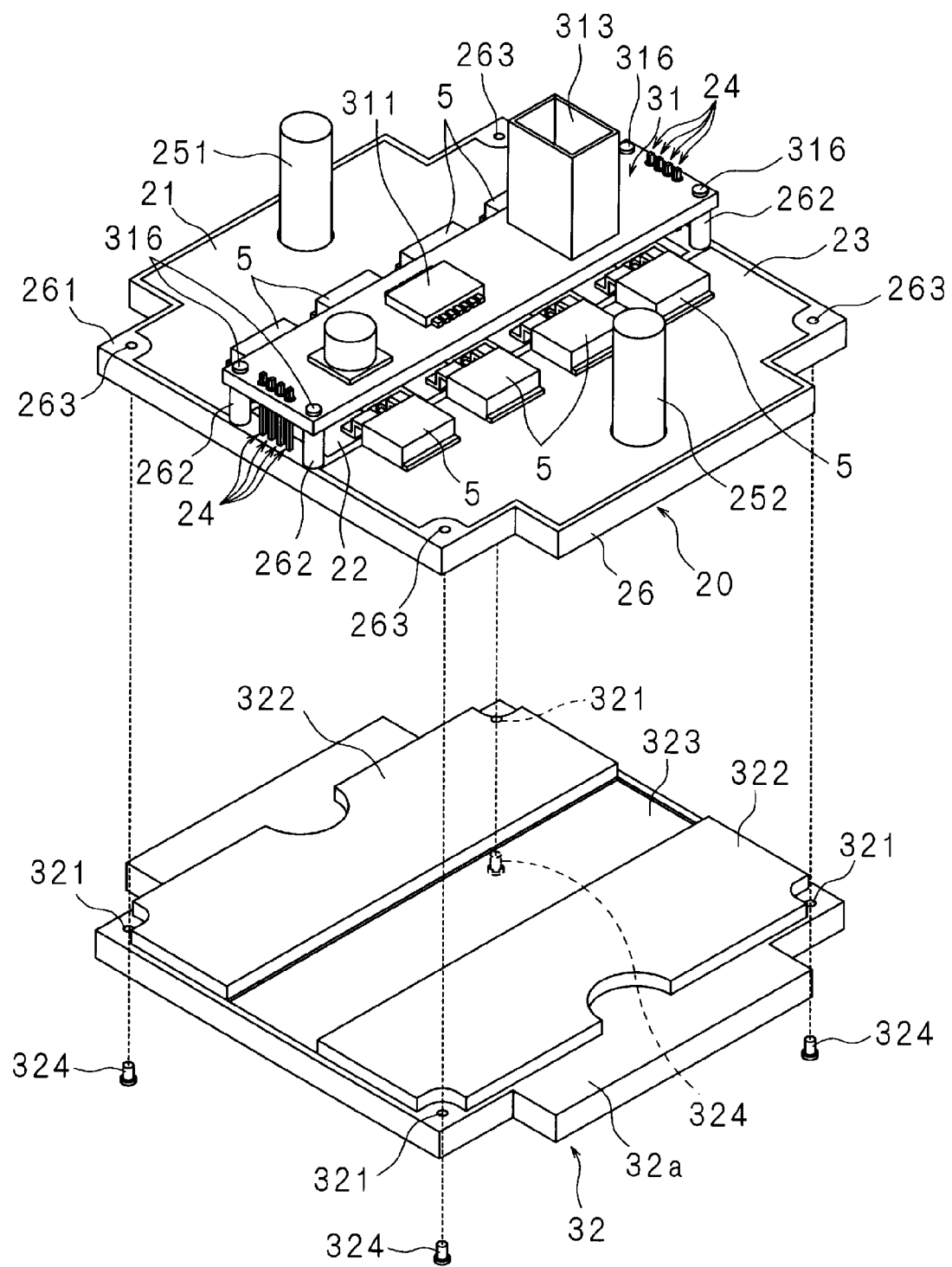
FIG. 10 is a perspective view illustrating how a heat dissipation member is attached to the base.

FIG. 10 is a perspective view illustrating how the heat dissipation member 32 is attached to the base 20.

As shown in FIGS. 2 and 10, the heat dissipation member 32 is shaped as a plate. A plurality of through holes 321 are provided in the heat dissipation member 32. The through holes 321 correspond to the screw holes 263 in the base 20. Two heat conductive portions 322 are provided on one side 32a of the heat dissipation member 32 so that the heat conductive portions 322 correspond to the two openings 264 of the base 20 (see FIG. 7). The heat conductive portions 322 are insulative and highly heat conductive, and are for example, heat conductive grease applied to one side 32a of the heat dissipation member 32. A recessed portion 323 is provided between the two heat conductive portions 322 on the one side 32a of the heat dissipation member 32.

The heat dissipation member 32 is attached to the base 20 so that the heat conductive portions 322 and the recessed portion 323 face upward, and the first bus bar 21 and the third bus bar 23 are attached to the heat dissipation member 32 via the heat conductive portions 322. Specifically, the two heat conductive portions 322 respectively fill the two openings 264 of the base 20 and come in contact with the first bus bar 21 and the third bus bar 23 (see FIG. 2). The heat dissipation member 32 is screwed to the base 20 by the screws 324 penetrating into the through holes 321 and being screwed to the screw holes 263. The second bus bar 22 is adjacent to the first bus bar 21 and the third bus bar 23 in the direction along the upper surface of the heat dissipation member 32. A portion of the insulating portion 26 that covers the lower surface of the second bus bar 22 opposes a bottom surface of the recessed portion 323 and is spaced apart from the heat dissipation member 32.

Figure 11:
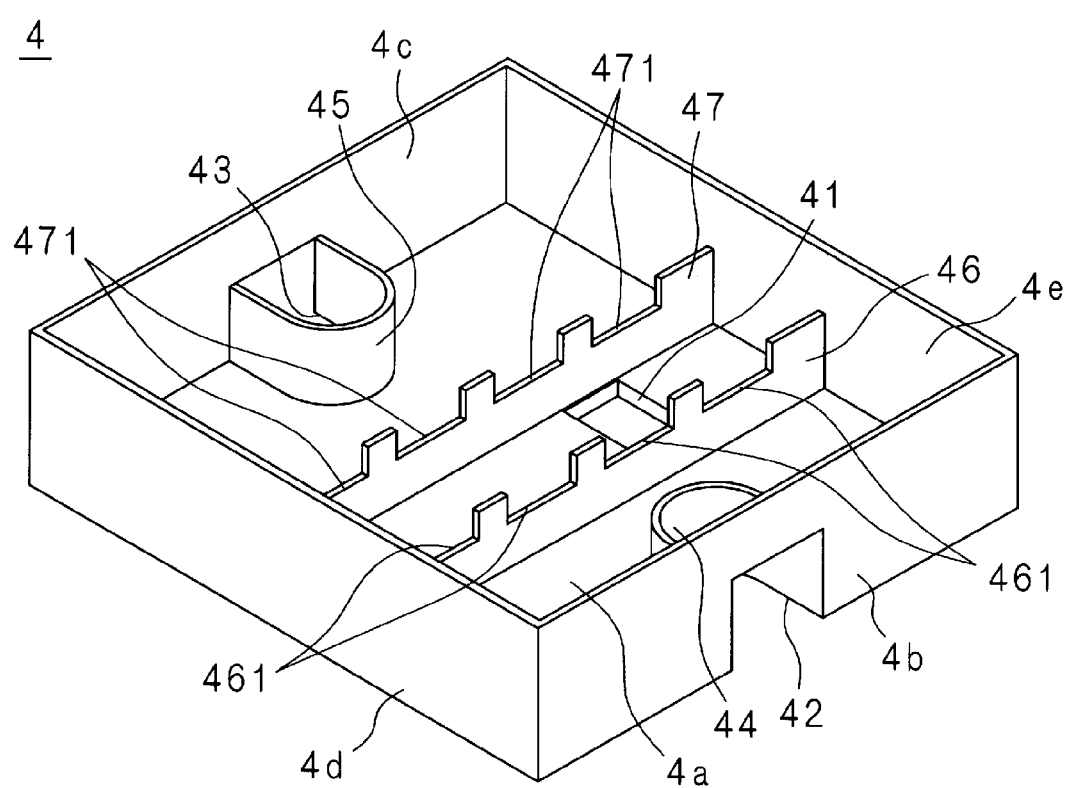
FIG. 11 is a perspective view of a cover.

FIG. 11 is a perspective view of the cover 4.

The cover 4 is shaped as a box having one open side. The cover 4 is insulating and made of a synthetic resin, for example.

As shown in FIGS. 1 to 3 and 11, the cover 4 includes a bottom wall 4a and four side walls 4b to 4e. The bottom wall 4a is rectangular. The side walls 4b to 4e stand upright from the four sides of the bottom wall 4a in the same direction. The side walls 4b and 4c are in parallel with each other, and the side walls 4d and 4e are in parallel with each other.

An opening 41 is provided in the middle of the bottom wall 4a. An opening 42 is provided in the middle of one side portion extending along the side wall 4b of the bottom wall 4a. The opening 42 reaches from the bottom wall 4a to the side wall 4b. An opening 43 is provided in the middle of one side portion that extends along the side wall 4c of the bottom wall 4a. The opening 43 reaches from the bottom wall 4a to the side wall 4c.

The cover 4 includes four partitioning plates 44 to 47. The partitioning plates 44 to 47 partition the inside of the cover 4.

The partitioning plates 44 and 45 have a half tubular shape, and the axial direction of the partitioning plates 44 and 45 is perpendicular to the bottom wall 4a. The partitioning plate 44 stands upright from a circumferential edge of the opening 42 in the bottom wall 4a, and the circumferential wall of the partitioning plate 44 is continuous with a circumferential edge of the opening 42 in the side wall 4b. The partitioning plate 45 has approximately the same configuration as that of the partitioning plate 44, and is provided on the circumferential edge of the opening 43.

The partitioning plates 46 and 47 are shaped as a plate and protrude vertically from the inner face of the bottom wall 4a. The partitioning plates 46 and 47 are in parallel with the side wall 4b and reach from the side wall 4d to the side wall 4e. The side wall 4b, the partitioning plates 46 and 47, and the side wall 4c are arranged in this order from the left to the right. The opening 41 is arranged between the partitioning plates 46 and 47. It is preferable that heat conductivity of the partitioning plates 46 and 47 is low.

Four cutouts 461 are provided in a top edge of the partitioning plate 46. Four cutouts 471 are provided in an edge of the partitioning plate 47. The four cutouts 461 of the partitioning plate 46 and the four cutouts 471 of the partitioning plate 47 (second partitioning plate) are arranged at the same positions in the direction in which the side walls 4d and 4e oppose each other.

The cover 4 is attached to the base 20 so that the bottom wall 4a of the cover 4 and the circuit board 31 are in parallel with each other and the side wall 4b faces leftward. The connector 313 of the circuit board 31 is fitted into the opening 41 of the cover 4. As a result, the shaft portions of the bolts 251 and 252, the circumferential edge of the opening of the through hole 211 of the first bus bar 21, and the circumferential edge of the opening of the through hole 231 of the third bus bar 23 are exposed from the openings 42 and 43. The cover 4 attached to the base 20 covers the eight switching elements 5 and the circuit board 31.

A first chamber 401, a second chamber 402, and a third chamber 403 are formed inside the cover 4.

The first chamber 401 is surrounded by the bottom wall 4a, the side walls 4b, 4d, and 4e, the partitioning plates 44 and 46 of the cover 4, and the first bus bar 21. The element bodies 50 and the drain terminals 52 of the four switching elements 5 on the left side are housed inside the first chamber 401.

Likewise, the third chamber 403 is surrounded by the bottom wall 4a, the side walls 4c, 4d, and 4e, the partitioning plates 45 and 47 of the cover 4, and the third bus bar 23. The element bodies 50 and the drain terminals 52 of the four switching elements 5 on the right side are housed inside the third chamber 403.

On the other hand, the second chamber 402 is surrounded by the bottom wall 4a, the side walls 4d and 4e, the partitioning plates 46 and 47 of the cover 4, and the second bus bar 22. The circuit board 31 is housed inside the second chamber 402. The source terminals 51 and gate terminals 53 of the switching elements 5 on the left side protrude toward the second chamber 402 via the cutouts 461 of the partitioning plate 46. The source terminals 51 and gate terminals 53 of the switching elements 5 on the right side protrude to the second chamber 402 via the cutouts 471 of the partitioning plate 47.

The electrical junction box 1 shown in FIGS. 1 to 3 is mounted in a vehicle which is not shown, for example. A cable connected to a power source is connected to the first bus bar 21 with the bolt 251, for example. A cable connected to a load is connected to the third bus bar 23 with the bolt 252, for example. A signal line connected to an electronic control unit (ECU), which is not shown, is connected to the connector 313, for example.

The control element 311 of the circuit board 31 communicates with the ECU via the connector 313. Also, the control element 311 outputs, to the driving circuit 312, a control signal for switching ON/OFF the switching elements 5. The driving circuit 312 applies a voltage for switching ON/OFF the switching elements 5 to the gate terminal 53 of the switching element 5 in accordance with the control signal input from the control element 311.

When the eight switching elements 5 are switched ON, the source terminals 51 and the drain terminals 52 of the switching elements 5 are electrically connected to each other, and therefore the first bus bar 21, the second bus bar 22, and the third bus bar 23 are electrically connected to each other. At this time, a current flows in the cable connected to the power source, the first bus bar 21, the four switching elements 5 on the left side, the second bus bar 22, the four switching elements on the right side, the third bus bar 23, and the cable connected to the load, thereby supplying power from the power source to the load.

When the switching elements 5 are switched OFF, the source terminals 51 and the drain terminals 52 of the switching elements 5 are electrically interrupted, and therefore the first bus bar 21, the second bus bar 22, and the third bus bar 23 are electrically interrupted from each other. At this time, a current that flows in the cable connected to the power source, the first bus bar 21, the four switching elements 5 on the left side, the second bus bar 22, the four switching elements on the right side, the third bus bar 23, and the cable connected to the load is interrupted, thereby power supply from the power source to the load is stopped.

When a current flows in the switching elements 5, the switching elements 5 (in particular, the element bodies 50) generate heat. Since heat resistance of the control element 311 is lower than heat resistance of the switching elements 5, it is necessary to prevent heat of a high temperature from being conducted from the switching elements 5 to the control element 311.

In the switching elements 5 on the left side, the drain terminals 52 are connected to the first bus bar 21, and the element bodies 50 are in contact with the first bus bar 21 via the drain terminals 52. Accordingly, most of the heat generated from the switching elements 5 on the left side is conducted to the first bus bar 21. Similarly, most of the heat generated from the switching elements 5 on the right side is conducted to the third bus bar 23.

Since the circuit board 31 is in no contact with the first bus bar 21 or the third bus bar 23, heat of a high temperature can be prevented from being conducted from the first bus bar 21 or the third bus bar 23 to the control element 311 of the circuit board 31.

Heat conducted from the eight switching element 5 to the first bus bar 21 and the third bus bar 23 is efficiently conducted to the heat dissipation member 32 via the two heat conductive portions 322. Accordingly, heat generated from the eight switching elements 5 is efficiently dissipated to the outside of the electrical junction box 1.

Heat generated from the switching elements 5 on the left side heats and convects the air in the first chamber 401. Heat generated from the switching element 5 on the right side heats and convects the air in the third chamber 403.

Since the circuit board 31 is housed in the second chamber 402, it is possible to prevent heat of a high temperature from being conducted to the circuit board 31 due to the air convection in the first chamber 401 or the third chamber 403.

In the switching elements 5, the source terminals 51 and the gate terminals 53 are connected to the second bus bar 22. Accordingly, heat generated from the switching elements 5 is also conducted to the second bus bar 22. However, the amount of heat conducted from the switching elements 5 to the second bus bar 22 is sufficiently small compared to the amount of heat conducted from the switching elements 5 to the first bus bar 21 (or the third bus bar 23). Furthermore, the lower surface of the second bus bar 22 is covered with the insulating portion 26, and the portion of the insulating portion 26 that covers the second bus bar 22 is spaced apart from the heat dissipation member 32. Accordingly, even if the heat dissipation member 32 is thermally saturated, there is no risk that heat will be conducted from the heat dissipation member 32 to the second bus bar 22. Furthermore, the circuit board 31 is in no contact with the second bus bar 22. Accordingly, heat of a high temperature can be prevented from being conducted from the second bus bar 22 to the control element 311 of the circuit board 31.

As a result of the above, it is possible to suppress heat from being conducted to the circuit board 31.

Accordingly, it is not necessary to employ a large heat dissipation member 32 for suppressing heat from being conducted to the circuit board 31. Furthermore, the first bus bar 21 also serves as the partitioning plate for partitioning the first chamber 401 from the outside, the second bus bar 22 also serves as the partitioning plate for partitioning the second chamber 402 from the outside, and the third bus bar 23 also serves as the partitioning plate for partitioning the third chamber 403 from the outside. Accordingly, the size of the electrical junction box 1 can be reduced.

Since the insulating portion 26 is provided between the first bus bar 21 (or the third bus bar 23) and the second bus bar 22, short circuits between the first bus bar 21 (or the third bus bar 23) and the second bus bar 22 can be prevented.

The base 20 formed by the first bus bar 21, the second bus bar 22, the third bus bar 23, and the like being formed in one piece can be easily handled when assembling the electrical junction box 1. The base 20 can be easily formed by insert molding in which a synthetic resin is poured into a mold into which the first bus bar 21, the second bus bar 22, and the third bus bar 23 and the like have been inserted.

The disclosed embodiments are illustrative examples in all aspects and should not be considered as restrictive. The scope of the present disclosure is defined not by the above description but by the claims, and is intended to encompass all modifications within the meaning and scope that are equivalent to the claims.

The invention claimed is:

1. An electric junction box comprising:
   a first conductive plate;
   a second conductive plate that is adjacent to the first conductive plate without contacting the first conductive plate;
   a switching element including a first terminal that is connected to the first conductive plate, a second terminal that is connected to the second conductive plate, and an element body on which the first terminal and the second terminal are provided;

a circuit board that opposes and is spaced apart from the second conductive plate; and a cover that is shaped as a box having an open side and covers the switching element and the circuit board, wherein the cover includes a partitioning plate that partitions an inside of the cover, a first chamber is formed inside the cover by the partitioning plate and the first conductive plate, the element body of the switching element is arranged in the first chamber, a second chamber is formed inside the cover by the partitioning plate and the second conductive plate, and the circuit board is arranged in the second chamber.

2. The electric junction box according to claim 1, including a heat dissipation member having one side in which a recessed portion is provided, wherein the first conductive plate is attached to the one side of the heat dissipation member, and the second conductive plate is adjacent to the first conductive plate in the direction along the one side of the heat dissipation member, opposes a bottom surface of the recessed portion of the heat dissipation member, and is spaced apart from the heat dissipation member.

3. The electric junction box according to claim 2, wherein the first conductive plate is attached to the one side of the heat dissipation member via an insulating heat conductive portion.

4. The electric junction box according to claim 1, further including:

a third conductive plate that is adjacent to the second conductive plate without contacting the second conductive plate; and a second switching element that has a third terminal connected to the third conductive plate, a fourth terminal connected to the second conductive plate, and a second element body on which the third terminal and the fourth terminal are provided, wherein the cover includes a second partitioning plate that partitions an inside of the cover, the second chamber is formed inside the cover by the partitioning plate, the second partitioning plate, and the second conductive plate, a third chamber is formed inside the cover by the second partitioning plate and the third conductive plate, and the second element body of the second switching element is arranged in the third chamber.

5. The electric junction box according to claim 2, further including:

a third conductive plate that is adjacent to the second conductive plate without contacting the second conductive plate; and a second switching element that has a third terminal connected to the third conductive plate, a fourth terminal connected to the second conductive plate, and a second element body on which the third terminal and the fourth terminal are provided, wherein the cover includes a second partitioning plate that partitions an inside of the cover, the second chamber is formed inside the cover by the partitioning plate, the second partitioning plate, and the second conductive plate, a third chamber is formed inside the cover by the second partitioning plate and the third conductive plate, and the second element body of the second switching element is arranged in the third chamber.

6. The electric junction box according to claim 3, further including:

a third conductive plate that is adjacent to the second conductive plate without contacting the second conductive plate; and a second switching element that has a third terminal connected to the third conductive plate, a fourth terminal connected to the second conductive plate, and a second element body on which the third terminal and the fourth terminal are provided, wherein the cover includes a second partitioning plate that partitions an inside of the cover, the second chamber is formed inside the cover by the partitioning plate, the second partitioning plate, and the second conductive plate, a third chamber is formed inside the cover by the second partitioning plate and the third conductive plate, and the second element body of the second switching element is arranged in the third chamber.

* * * * *